(12) United States Patent
Beaman et al.

(10) Patent No.: US 6,891,360 B1
(45) Date of Patent: May 10, 2005

(54) PLATED PROBE STRUCTURE

(75) Inventors: Brian Samuel Beaman, Apex, NC (US); Keith Edward Fogel, Mohegan Lake, NY (US); Paul Alfred Lauro, Nanuet, NY (US); Eugene John O'Sullivan, Nyack, NY (US); Da-Yuan Shih, Poughkeepsie, NY (US); Ho-Ming Tong, Taipei (TW)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/165,832

(22) Filed: Oct. 2, 1998

Related U.S. Application Data
(60) Provisional application No. 60/060,878, filed on Oct. 2, 1997.

(51) Int. Cl.[7] ................................................ G01R 31/02
(52) U.S. Cl. .......................... 324/72.5; 324/754; 29/854
(58) Field of Search ................................ 324/72.5, 754; 29/854, 592.1, 593

(56) References Cited

U.S. PATENT DOCUMENTS

| | | | | |
|---|---|---|---|---|
| 5,450,290 A | * | 9/1995 | Boyko et al. | ................ 361/792 |
| 5,665,650 A | * | 9/1997 | Lauffer et al. | ................ 216/20 |
| 5,785,538 A | * | 7/1998 | Beaman et al. | ................ 439/91 |
| 5,811,982 A | * | 9/1998 | Beaman et al. | ............. 324/762 |

* cited by examiner

*Primary Examiner*—Vincent Q. Nguyen
(74) *Attorney, Agent, or Firm*—Thomas A. Beck; Daniel P. Morris

(57) ABSTRACT

A plated test probe structure for testing electrical connections to integrated circuits (IC) devices with solder bumped interconnection pads that are an integral part of the fan-out wiring on the test substrate, or other printed wiring device.

7 Claims, 11 Drawing Sheets

FIGURE I

Plated Integrated Probe (PIP)

Plated Integrated Probe (PIP)

US 6,891,360 B1

PLATED PROBE STRUCTURE

This application claims the benefits of Provisional application Ser. No. 60/060/878, filed Oct. 2, 1991.

FIELD OF THE INVENTION

The present invention is directed to probe structures for testing of electrical interconnections to integrated circuit devices and other electronic components and particularly to testing of integrated circuit devices with solder bumped interconnection pads.

BACKGROUND OF THE INVENTION

Integrated circuit (IC) devices and other electronic components are normally tested to verify the electrical function of the device and certain devices require high temperature burn-in testing to accelerate early life failures of these devices. Wafer probing is typically done on a single chip site at temperatures ranging from 25° C.–125° C. while burn-in is typically done on diced and packaged chips at temperatures ranging from 80° C. to 150° C. Wafer probing and IC chip burn-in at elevated temperatures of up to 200° C. has several advantages and is becoming increasingly important in the semiconductor industry. Simultaneous testing of multiple chips on a single wafer has obvious advantages for reducing costs and increasing production throughput and is a logical step towards testing and burn-in of an entire wafer.

The various types of interconnection methods used to test these devices include permanent semi-permanent, and temporary attachment techniques. The permanent and semi-permanent techniques that are typically used include soldering and wire bonding to provide a connection from the IC device to a substrate with fan out wiring or a metal lead frame package. The temporary attachment techniques include rigid and flexible probes that are used to connect the IC device to a substrate with fan out wiring or directly to the test equipment.

The permanent attachment techniques used for testing integrated circuit devices such as wire bonding to a leadframe of a plastic leaded chip carrier are typically used for devices that have low number of interconnections and the plastic leaded chip carrier package is relatively inexpensive. The device is tested through the wire bonds and leads of the plastic leaded chip carrier and plugged into a test socket. If the integrated circuit device is defective, the device and the plastic leaded chip carrier are discarded.

The semi-permanent attachment techniques used for testing integrated circuit devices such as solder ball attachment to a ceramic or plastic pin grid array package are typically used for devices that have high number of interconnections and the pin grid array package is relatively expensive. The device is tested through the solder balls and the internal fan out wiring and pins of the pin grid array package that is plugged into a test socket. If the integrated circuit device is defective, the device can be removed from the pin grid array package by heating the solder balls to their melting point. The processing cost of heating and removing the chip is offset by the cost saving of reusing the pin grid array package.

The most cost effective techniques for testing and burn-in of integrated circuit devices provide a direct interconnection between the pads on the device to a probe sockets that is hard wired to the test equipment. Contemporary probes for testing integrated circuits are expensive to fabricate and are easily damaged. The individual probes are typically attached to a ring shaped printed circuit board and support cantilevered metal wires extending towards the center of the opening in the circuit board. Each probe wire must be aligned to a contact location on the integrated circuit device to be tested. The probe wires are generally fragile and easily deformed or damaged. This type of probe fixture is typically used for testing integrated circuit devices that have contacts along the perimeter of the device. This probe is also much larger than the IC device that is being tested and the use of this type of probe for high temperature testing is limited by the probe structure and material set.

More specifically, the prior art includes probe fixtures for testing bare IC chips. For example, U.S. Pat. No. 5,177,439 is directed to fixture for testing bare IC chips. The fixture is manufactured from a silicon wafer or other substrate that is compatible with semiconductor processing. The substrate is chemically etched to produce a plurality of protrusions to match the I/O pattern on the bare IC chip. The protrusions are coated with a conductive material and connected to discrete conductive fan-out wiring paths to allow connection to an external test system. It is important to note that the probe geometry described in this patent does not provide a compliant interface for testing the aluminum bond pads on the IC device and does not provide a wiping contact interface. The substrate used for fabrication of this probe fixture is limited to semiconductor wafers which are relatively expensive.

The high density probe of the present invention with controlled wipe can be fabricated on a variety of inexpensive substrates with the fan-out wiring.

SUMMARY OF THE INVENTION

It is the object of the present invention to provide a probe for testing integrated circuit devices and other electronic components that use solder bumped pads for the interconnection means.

Another object of the present invention is to provide a probe structure that is an integral part of the fan out wiring on the test substrate or other printed wiring means to minimize the electrical conductor length as well as the contact resistance of the probe interface.

A further object of the present invention is to provide a probe with a sculptured contact interface that facilitates alignment of the solder ball connection on the IC device to the test probes.

An additional object of the present invention is a sculptured contact interface that facilitates penetration of the oxides on the surface of the solder bumped interconnection on the IC device.

The invention embodies a plated test probe used for making electrical contact with a plurality of solder ball connections on an integrated circuit device. The elements thereof include a first fan-out substrate having a first surface and the first surface has a plurality of contact locations with a plurality of plated bumps attached to said plurality of contact locations. The fan-out substrate may consist of any of the following: multilayer ceramic substrates with thick film wiring, multilayer ceramic substrates with thin film wiring, metallized ceramic substrates with thin film wiring, epoxy glass laminate substrates with copper wiring, or silicon substrates with thin film wiring.

More particularly, the probe structure of the present invention may conveniently comprise a multilayer structure (or combinations thereof) on a rigid base substrate having thereon a first adhesion layer formed from a material selected from the group consisting of Cr, Ti, Ta, Hf, Mo, W, Nb, V, Zr, and alloys thereof; a second layer comprising the predominate constituent of a metal bump formed from a material selected from the group consisting of Cu, Pd, Au, Ni, Co, Fe and alloys thereof; and a third contact metallurgy layer formed from a material selected from the group consisting of Re, Rh, Ru, Pd, Pt, Au, and alloys thereof; said plated probe being plated on said substrate.

The substrate used in combination with the probe structure according to the present invention is formed from a material selected from the group consisting of a polyimide and copper laminate, a polyimide and Invar laminate or a copper/Invar/copper and Invar laminate. ("Invar" is an alloy containing 633.8% iron, 36% nickel, 0.2% carbon and having a low coefficient of expansion.) The substrate may conveniently be formed from a material that possesses a thermal expansion coefficient substantially the same as that of silicon. The probe structure sheet has redistribution wiring and through vias and is plated through openings therethrough.

Other objects and features as well as additional details of the present invention will become apparent from the following detailed description and annexed drawings of the presently preferred embodiments thereof, when considered in conjunction with the associated drawings.

BRIEF DESCRIPTION OF THE DRAWINGS

These and other objects, features, and advantages of the present invention will become apparent upon further consideration of the following detailed description of the invention when read in conjunction with the drawing figures, in which.

DETAILED DESCRIPTION OF THE INVENTION

Figure 1:
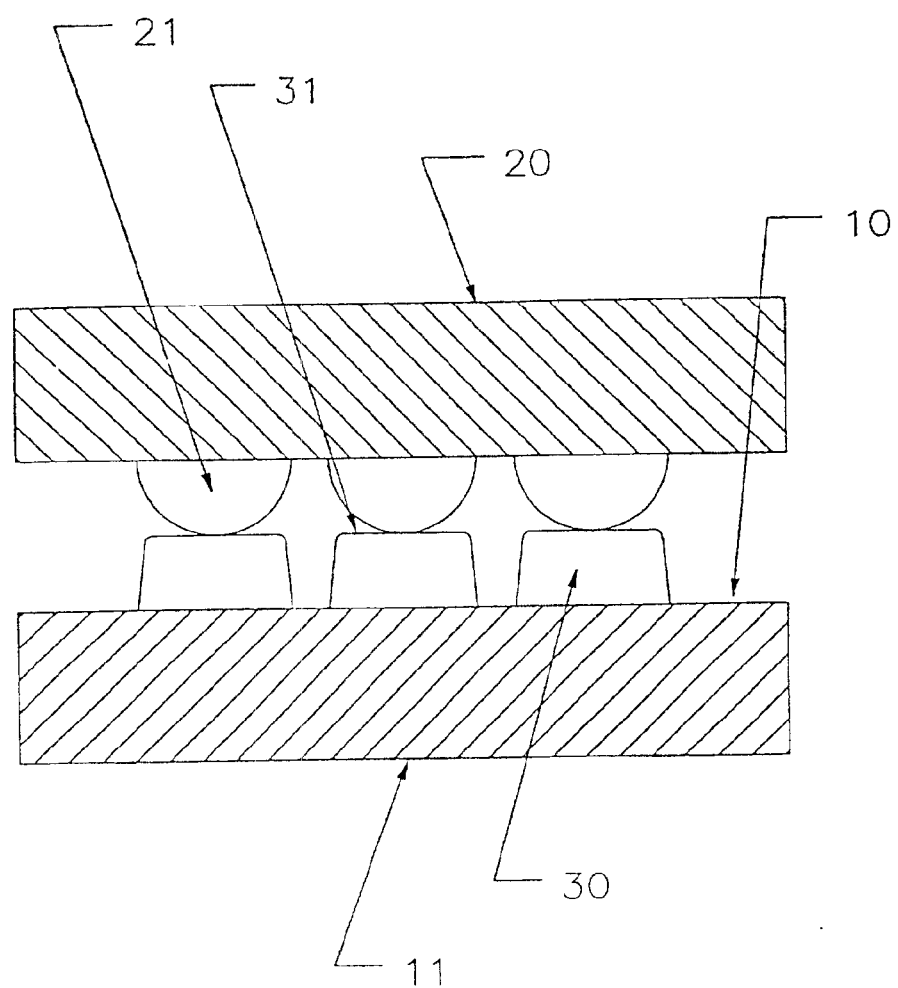
FIG. 1 shows a cross section of the preferred embodiment of the test probe attached to a substrate and pressed against the solder ball connections on an integrated circuit device.

In a preferred embodiment, FIG. 1 shows a cross section of a test substrate (11) and a plated test probe (30) according to the present invention. The test substrate (11) provides a rigid base for attachment of the probes (30) and fan-out wiring from the high density array of probe contacts to a larger grid of pins or other interconnection means to the equipment used to electrically test the integrated circuit device. The fan out substrate can be made from various materials and constructions including single and multi-layer ceramic with thick or thin film wiring, silicon wafer with thin film wiring or epoxy glass laminate construction with high density copper wiring. Test probes (30) are attached to the first surface (10) of the substrate (11). The probes are used to contact the solder ball connections (21) on the integrated circuit device (20) at surface (31).

Figure 2:
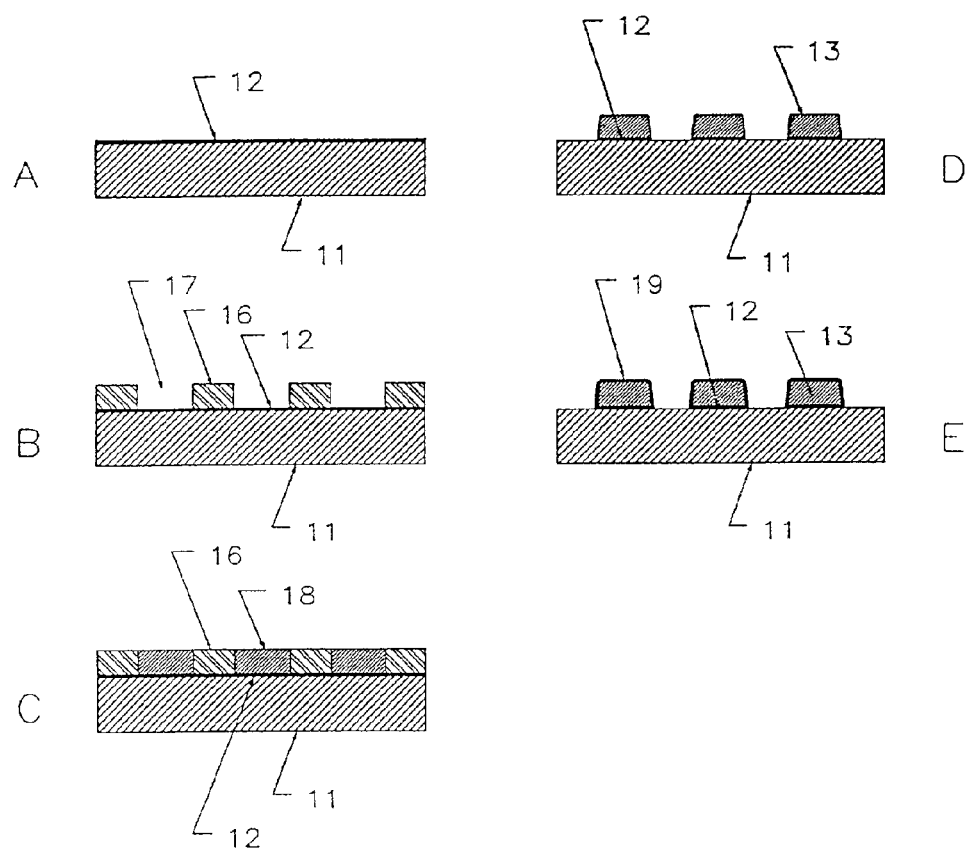
FIGS. 2A through 2E show the process steps for an additive plating process for fabricating the test probe.

FIGS. 2A through 2E show the steps for an additive plating process used for fabricating a test probe. The probes are fabricated on substrate (11) by first depositing on substrate (11), a blanket conducting plating base (seed) layer (12) as shown in FIG. 2A. This consists of an adhesion layer, 50–500 angstroms in thickness, of either sputtered Cr, Ta Zr, or Ti; followed by either Cu, Ni, or Au, which can be any thickness greater than 1000 angstroms, typically 1000–10,000 angstroms. A layer of photo resist (16) is applied next as shown in FIG. 2B. Positive or negative resists (16) may be employed. In the case of positive resist, a Novolac type such as Shipley SJR 3740 can be used, or an AZ type resist, to obtain thicknesses of up to 50–100 microns by spin coating.

Another approach is to use a dry film resist, such as Vackrel or Riston, which is laminated to the substrate. Yet another, more expensive approach is to laminate PMMA to the substrate and expose the desired pattern using X-ray radiation. This has the advantage of generating extremely straight-wall profiles up to several hundred microns in thickness. Alternatively, a negative resist such as Shell Epon SU8 suitably photosensitized, may be employed. However, while this yields reasonably straight-wall profiles (approximately 85 degree wall angles), the resist is difficult to remove after plating due to the unavailability of a good solvent for this resist when it is cured.

After patterning resist (16) as shown in FIG. 2B, the substrate is reactive ion-etched in an oxygen plasma to remove any resist residue from the exposed Cu regions. The probes are then formed in the openings (17) of the photo resist (16) layer by electroplating Cu Ni or Pd typically to a thickness in the range 2–6 mils as is shown in FIG. 2C. A standard, commercially available acid Cu electroplating solution may be used. However, suitable copper plating solutions may be formulated, if necessary, using copper sulfate, sulfuric acid, water and suitable additives known in the art. Current densities which can be used depend somewhat on the plating bath used, but are suitably in the range 5–50 mA/cm$^2$.

After electroplating, resist (16) is stripped, exposing the plating base layer (12). The latter is removed from between the probe features (13) by either ion beam etching, chemical methods, e.g. HF solution removal of Ti and persulfate solution removal the thin Cu layer, or combinations of chemical and dry process methods. Removing the unused plating base (seed) layer electrically isolates the plated probe features (13) as shown in FIG. 2D. To optimize the contact interface with the solder ball connections, a number of shapes can be engraved into the photo-resist patterning to generate the desired contact geometries as shown in FIGS. 6 through 11.

If the copper probes are plated, its features (13) are next coated (19) as shown in FIG. 2E to increase the hardness of the contact regions of the probes, and thus reduce wear and deformation. Cu probes (13) can be coated (19) with electroless Pd to a thickness of 0.5 to 2 microns. The Cu may first be catalyzed with Pd seed solution, if Pd catalyst is desired to initiate plating in a chosen electroless Pd solution, e.g. a hypophosphite-based solution. Protective coatings such as Pd/Ni and other Pd alloys, and Pt may also be employed for this purpose. Alternatively, the probes can also be capped with a suitable "contact metallurgy" which, depending on applications, can be Au, Ni, Pd, Pt, Fe, Al, Ru, Rh, Ir, Re; or alloys of these elements. The contact metallurgy protect the probes in contact with other metals at elevated temperatures in air without degradation.

Figure 3:
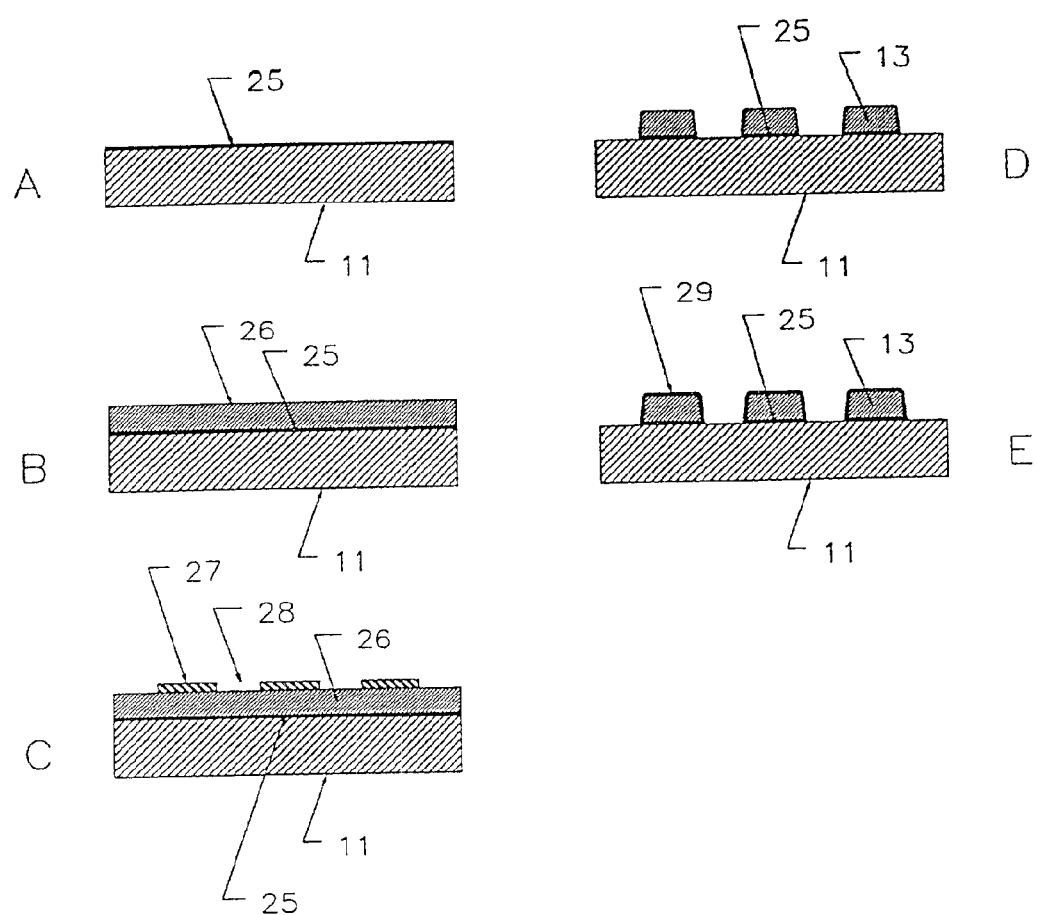
FIGS. 3A through 3E show the process steps for a subtractive plating process for fabricating the test probe.

FIGS. 3A through 3E depict the sequence of steps for a subtractive plating process used for fabricating a test probe. Referring to FIG. 3A, a suitable substrate (11), e.g. an multilayer ceramic substrate or a printed circuit board, is first coated with a conductive plating base (seed) layer (25) as described previously. A thick layer of Cu (26) is electroplated on the base layer (25) to a thickness of 2–7 mils as shown in FIG. 3B. Photo-resist (27) is next applied to the plated Cu layer and patterned as shown in FIG. 3C. Copper is then etched in a controlled manner from the open regions of the resist (28), leaving Cu probes (13) protected on top by photo resist.

To optimize the contact interface with the solder ball connections on the IC device, a number of shapes can be engraved into the photo resist patterning to generate the desired contact geometries as are shown in FIGS. 6 through 11. The adhesion layer employed under Cu may be removed (FIG. 3D) by either ion beam etching or chemical dissolution methods, e.g. HF solution in the case of Ti. The remaining resist may then be removed. A suitable contact metallurgy (29), as described in the additive plating process, is next deposited on the probe features (FIG. 3E).

Figure 4:
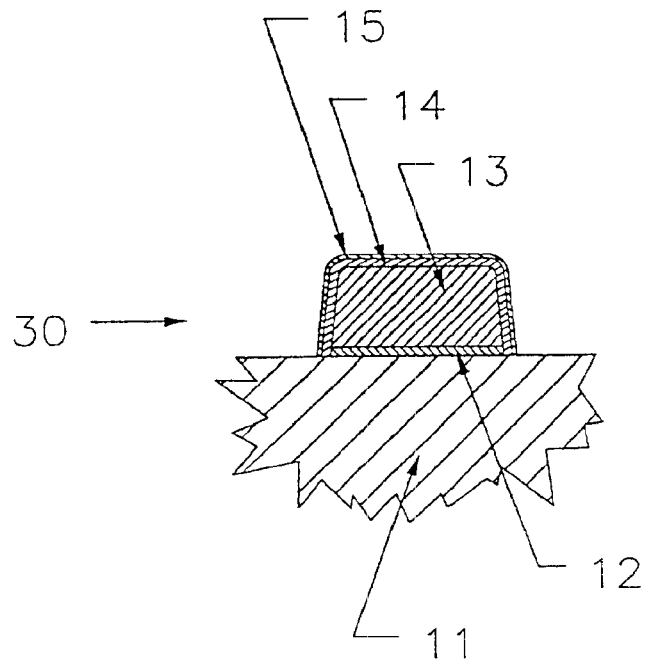
FIG. 4 shows a magnified cross section of the preferred embodiment of the test probe with the details of the different plating metallurgies.

FIG. 4 shows a cross section of the standard embodiment of plated test probe (30), depicting substrate (11), a blanket conducting plating base (seed) layer (12), Cu probe (13), barrier metallurgy (14) and contact metallurgy (15).

Figure 5:
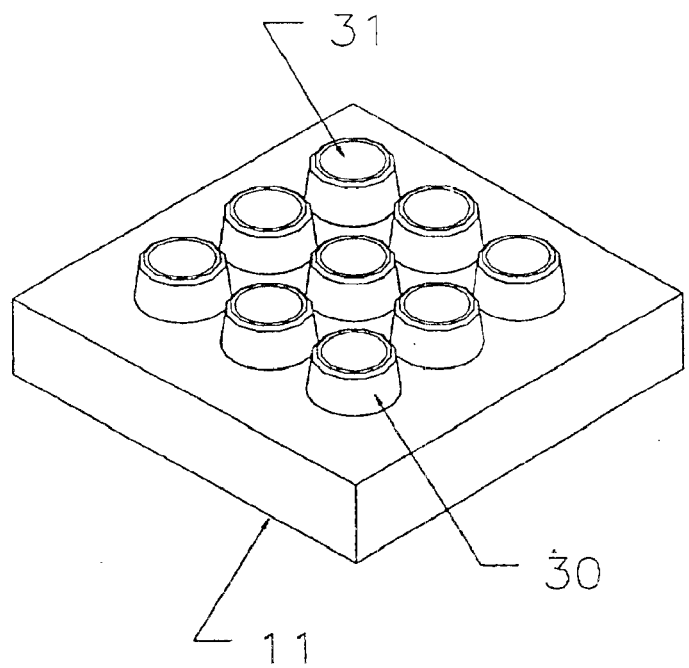
FIG. 5 shows an isometric view of the area array configuration of the test probes on the substrate.

FIG. 5 shows an isometric view of the standard embodiment of the test probe (30). The standard embodiment of the test probe (30) has a simple flat (31) contact surface on the top of the probe. The probe is typically plated with a barrier metallurgy (14) and a contact metallurgy (15). The barrier metallurgy (14) is used to prevent the formation of intermetallics between the base copper probe (13) material and the noble metal used for the contact metallurgy (15). The probes can be formed in any pattern necessary to mirror the pattern of solder ball connections on the IC device.

The present invention comprises a number of embodiments different from that described above which are suitable for use in achieving the benefits conferred by the above described embodiment.

Figure 6:
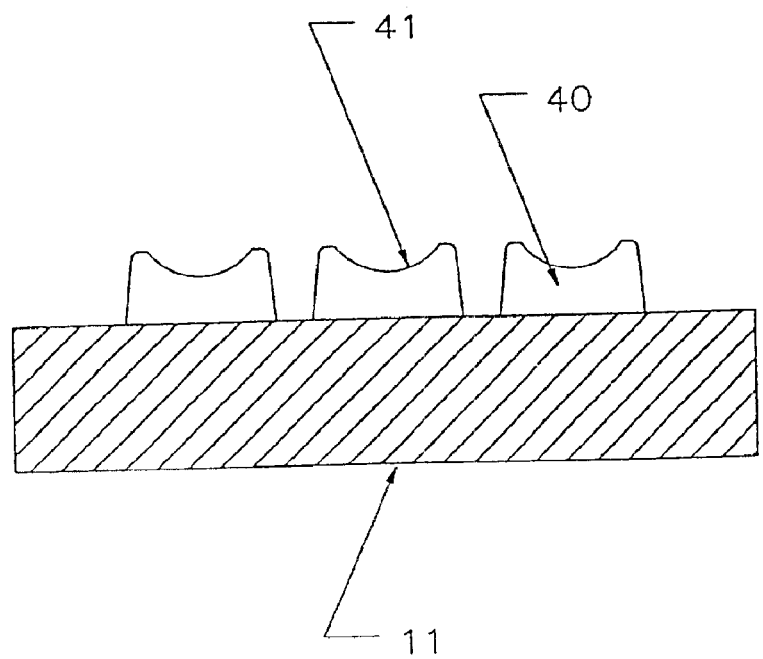
FIG. 6 shows a cross section of a first alternate embodiment of the test probe with a concave contact surface.
Figure 7:
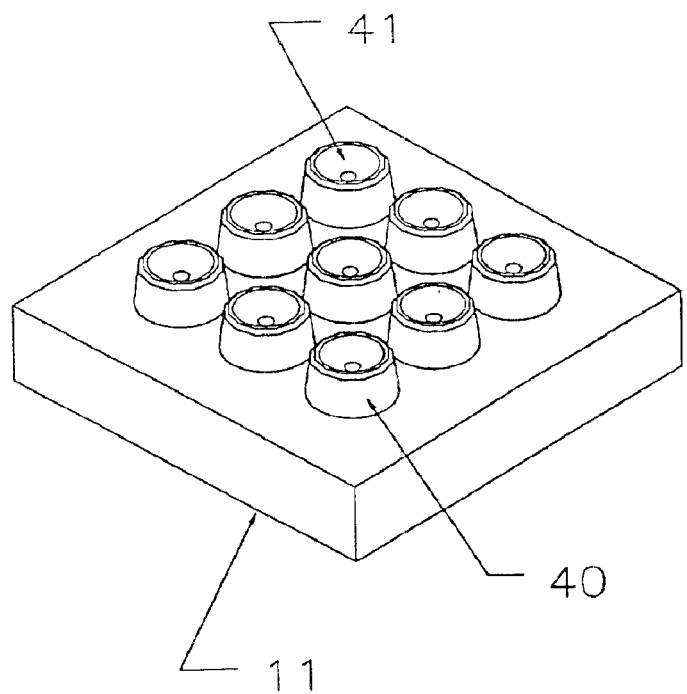
FIG. 7 shows an isometric view of a first alternate embodiment of the test probe with a concave contact surface.

FIG. 6 depicts a cross section of a first alternate embodiment of the plated test probe (40). The first alternate embodiment of test probe (40) includes an additional concave feature (41) that has been formed by selective etching the top surface of the probe. The concave feature (41) is useful to facilitate alignment of the solder ball connections on the IC device to test probes (40). FIG. 7 shows an isometric view of the first alternate embodiment of test probe (40).

Figure 8:
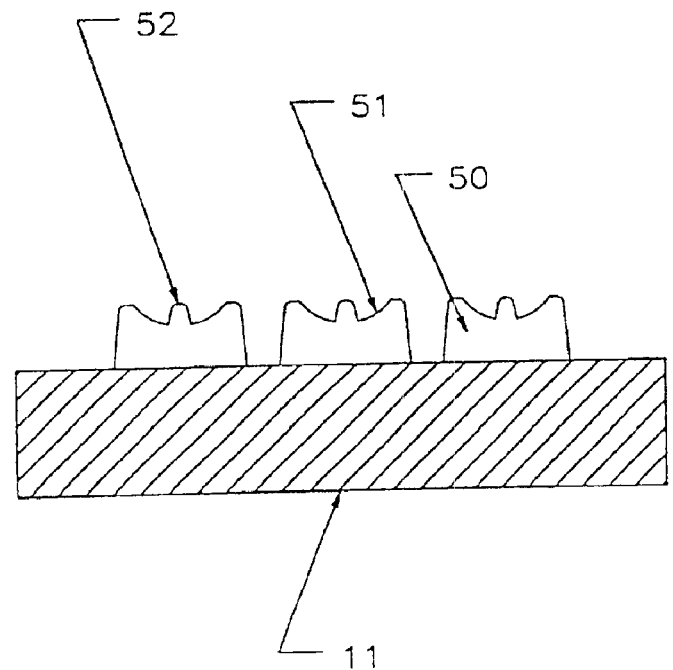
FIG. 8 shows a cross section of a second alternate embodiment of the test probe with a sculptured contact surface.
Figure 9:
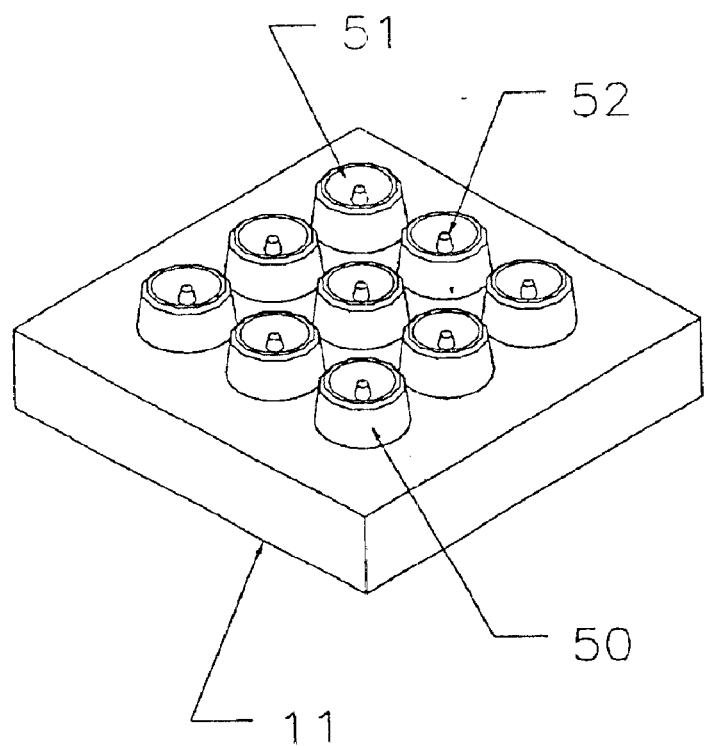
FIG. 9 shows an isometric view of a second alternate embodiment of the test probe with a sculptured contact surface.

FIG. 8 depicts a cross section of a second alternate embodiment of the plated test probe (50). The second alternate embodiment of test probe (50) includes the concave feature (51) used on the first alternate embodiment described above, along with a small raised pointed feature (52) in the center of the concave feature (51). Both the concave feature (51) and the raised pointed feature (52) are formed by selectively etching the top surface of the probe. The small raised pointed feature (52) is used to facilitate penetration of the oxide on the surface of the solder ball connection. FIG. 9 shows an isometric view of the second alternate embodiment of the test probe (50).

Figure 10:
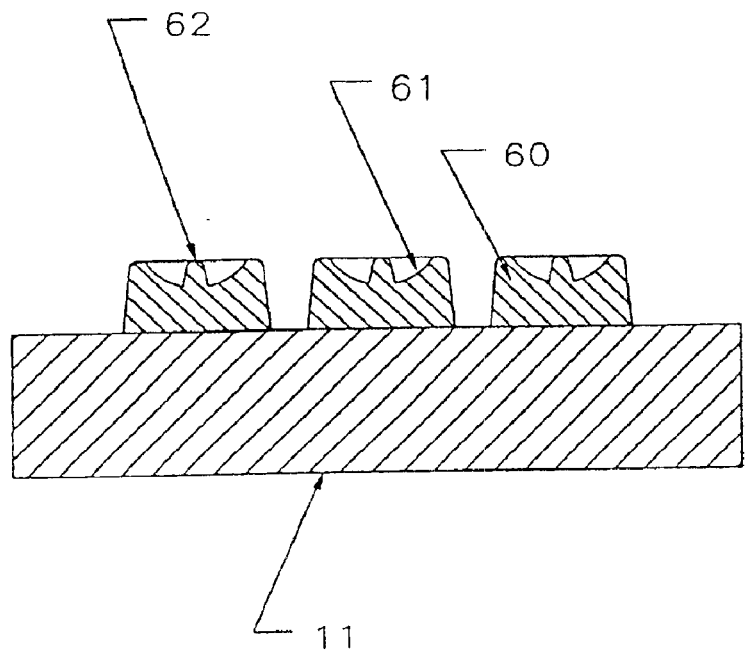
FIG. 10 shows a cross section of a third alternate embodiment of the test probe with a sculptured contact surface.
Figure 11:
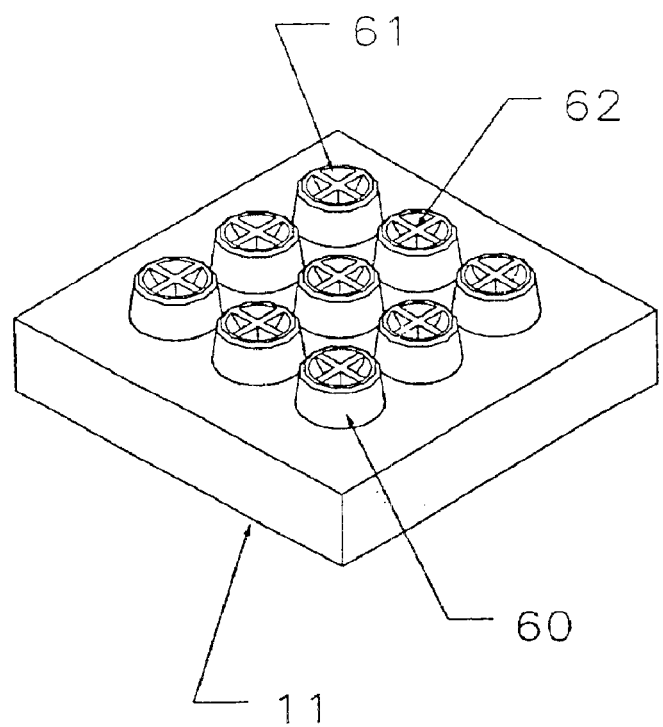
FIG. 11 shows an isometric view of a third alternate embodiment of the test probe with a sculptured contact surface.

FIG. 10 depicts a cross section of a third alternate embodiment of the plated test probe (60). The third alternate embodiment of the test probe (60). includes the concave feature (61) used on the first alternate embodiment along with a raised cross feature (62). The raised cross feature (62) is also used to facilitate penetration of the oxide on the surface of the solder ball connection on the IC device. FIG. 11 shows an isometric view of the third alternate embodiment of the test probe (60). Additional alternate test probe geometries can be formed by combining various recessed features with raised features to facilitate alignment to the solder ball connections or penetration of the oxide on the surface of the solder ball connections.

Figure 12:
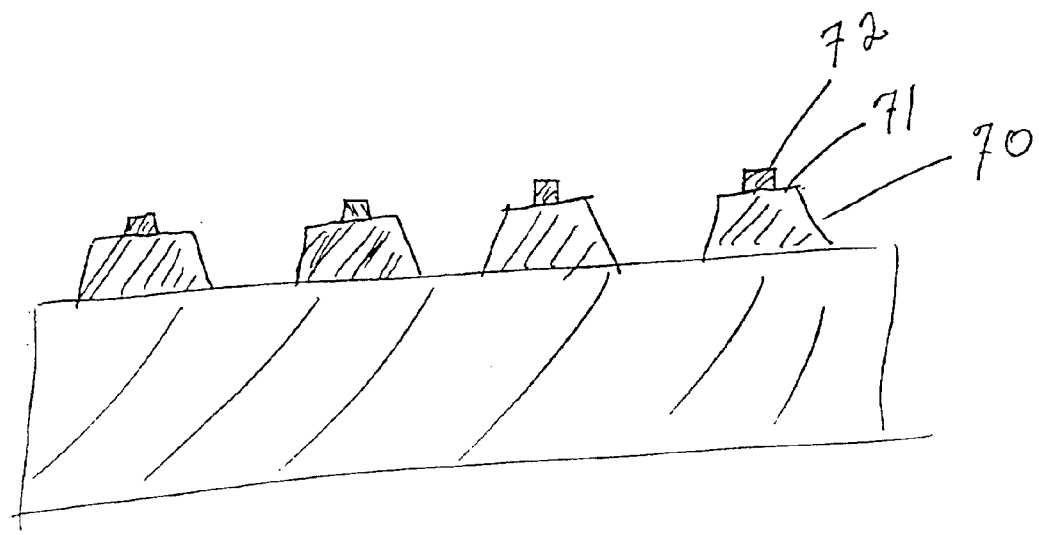
FIG. 12 shows a cross section of a fourth alternate embodiment of the test probe with a raised pointed contact feature on top of the surface of the test probes.
Figure 13:
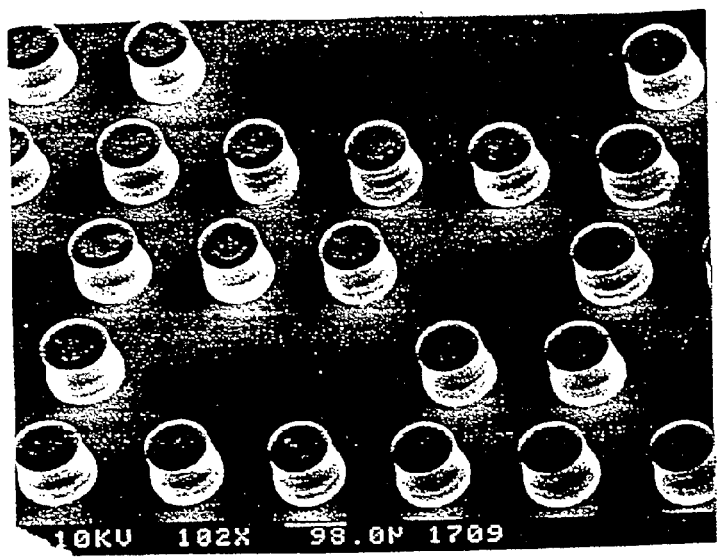
FIG. 13 is an SEM photograph of an isometric magnified view of the test probes of the present invention.
Figure 14:
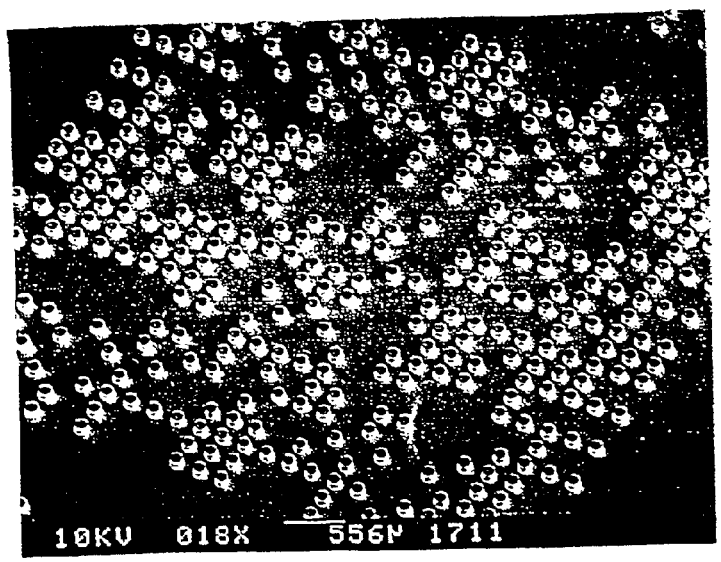
FIG. 14 is an SEM photograph of an isometric view of a plurality of the test probes shown in FIG. 13.
Figure 15:
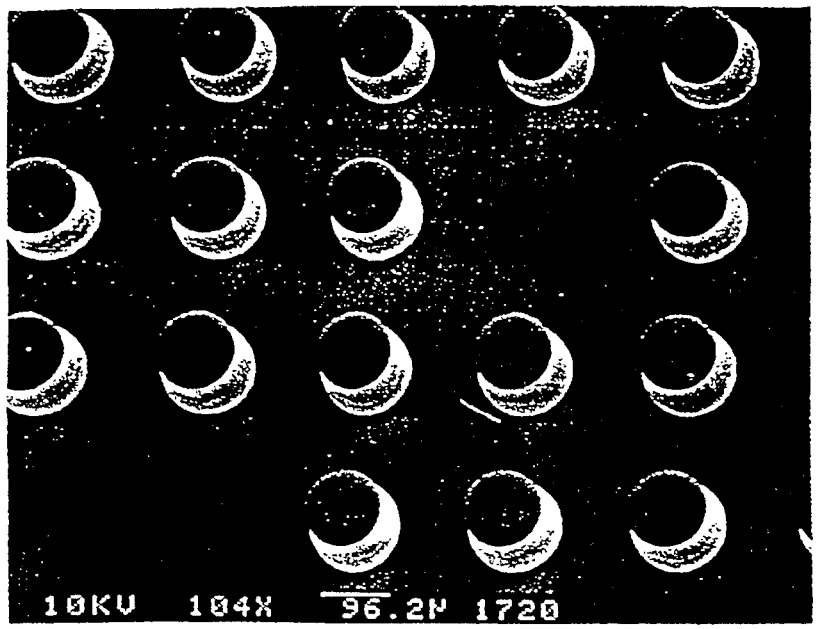
FIG. 15 is an SEM photograph top-oblique view of the test probes of the present invention.
Figure 16:
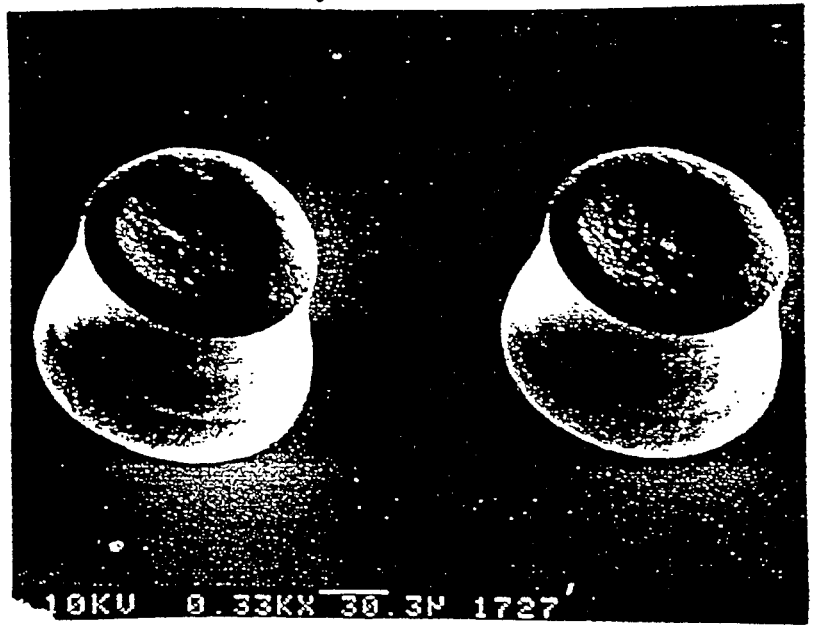
FIG. 16 is an SEM photograph isometric magnified view of the test probe of the present invention.

FIG. 12 depicts a cross section of a fourth alternate embodiment of the plated test probe (70). A raised pointed contact feature, i.e., protrusion (72) is processed on top of probe contact surface (71) to facilitate the penetration of the oxide layer on metals.

FIGS. 13 to 16 are SEM photographs showing various isometric views of the embodiments of the test probes of the present invention.

Figure 17:
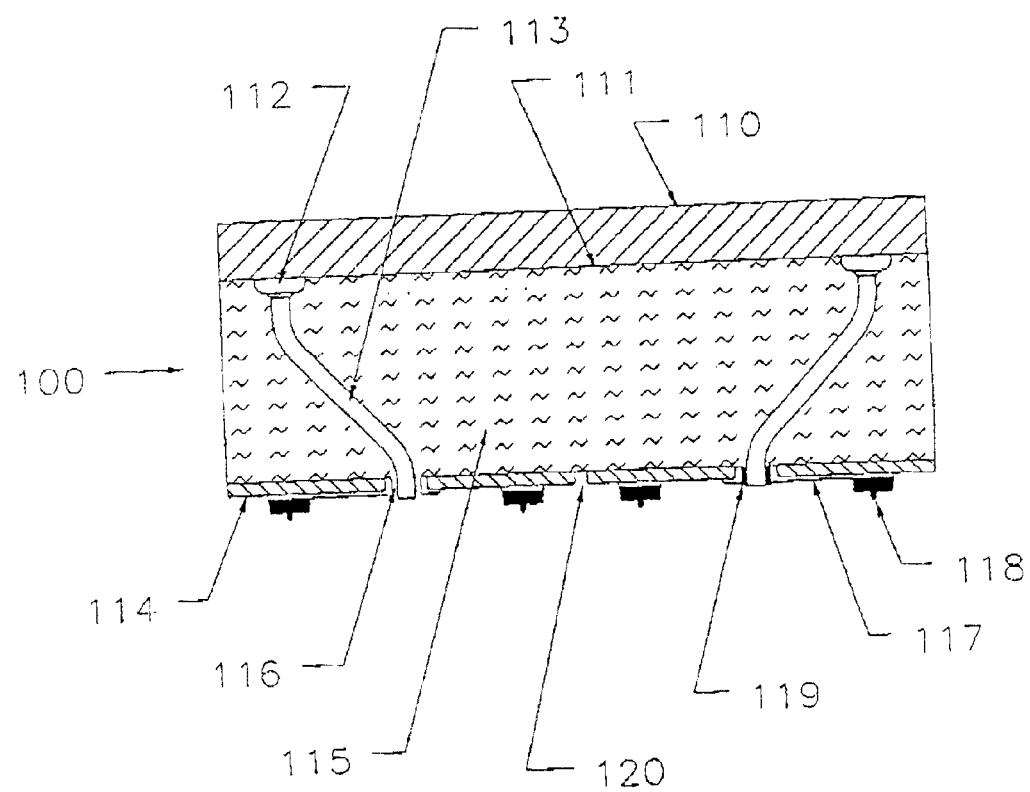
FIG. 17 shows a cross section of a fifth alternate embodiment of the test probe with a compliant probe interface.

FIG. 17 shows an isometric view of the fifth alternate embodiment of plated test probe (100). The probe contacts (118) are plated on a flexible film substrate (114) that has redistribution wiring (117) and plated through holes (116). The flex film substrate (114) and probe contacts (118) are assembled onto a rigid substrate (110) with wire leads (113) and a layer of a elastic material (115). The wire leads (113) are bonded (112) to the first surface (111) of the rigid substrate (110) and the ends of the wire leads (113) are solder reflow connected (119) to the plated through holes (116) on the flex film substrate. The use of the flexible film substrate (114) supported by the layer of elastic material (115) provides a compliant interface for the probe contacts (118). Slits (120) can be created in the flexible film substrate (114) to provide increased compliance for the probe contacts (118).

Thus, while there have been shown and described and pointed out fundamental novel features of the invention as applied to currently preferred embodiments thereof it will be understood that various omissions and substitutions and changes in the form and details of the method and apparatus illustrated, and in their operation, may be made by those skilled in the art without departing from the spirit of the invention. In addition it is to be understood that the drawings are not necessarily drawn to scale but that they are merely conceptual in nature. It is the invention, therefore, to be limited only as indicated by the scope of the claims appended herewith. These claims should be construed to maintain the proper protection for the invention first disclosed.

What is claimed is:

1. A plated test probe for making electrical contact with a plurality of solder ball connections on an integrated circuit device comprising:
   a first fan-out substrate having a first surface;
     wherein said ran out substrate comprises:
       multilayer ceramic substrates with thick film wiring;
       multilayer ceramic substrates with thin film wiring;
       metallized ceramic substrates with thin film wiring;
       epoxy glass laminate substrates with copper wiring; or
       silicon substrates with thin film wiring:
   said first surface having a plurality of contact locations;
   a plurality of plated bumps attached to said plurality of contact locations;
   said plated probe comprising a multilayer structure having:
   a first adhesion layer formed from a material selected from the group consisting of Cr, Ti, Ta, Hf, Mo, W, Nb, V, Zr, and alloys thereof;
   a second layer comprising the predominate constituent of a metal bump formed from a material selected from the group consisting of Cu, Pd, Au, Ni, Co, Fe and alloys thereof,
   a third contact metallurgy layer formed from a material selected from the group consisting of Re, Rh, Ru, Pd, Pt, Au, and alloys thereof.

2. The plated test probe according to claim 1, which further includes a raised cross feature located on the top surface of said plated probe.

3. The probe structure according to claim 1, which further includes a raised pointed contact feature on top of the flat metal bump surface.

4. The plated probe structure according to claim 1 wherein a diffusion barrier layer is inserted underneath said contact metallurgy layer.

5. The plated probe structure according to claim 4 wherein said the diffusion barrier layer is formed from a material selected from the group consisting of Cr, Ti, Ta, Zr, Ni, Fc, and alloys thereof.

6. The plated test probe according to claim 1 wherein said plated metal bump possesses a top surface having a concave geometry feature on said top surface of said plated bump.

7. The plated lest probe according to claim 6, wherein said concave geometry feature on the top surface of said plated bumps further includes a raised pointed contact feature located in the center of said plated bump.

* * * * *